(12) United States Patent
Streppel

(10) Patent No.: US 10,170,672 B2
(45) Date of Patent: Jan. 1, 2019

(54) OPTICAL ELEMENT AND OPTOELECTRONIC COMPONENT

(71) Applicant: OSRAM Opto Semiconductors GmbH, Regensburg (DE)

(72) Inventor: Ulrich Streppel, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/844,094

(22) Filed: Sep. 3, 2015

(65) Prior Publication Data

US 2016/0072030 A1    Mar. 10, 2016

(30) Foreign Application Priority Data

Sep. 8, 2014 (DE) .................. 10 2014 112 891

(51) Int. Cl.
| | | |
|---|---|---|
| *G02B 3/08* | (2006.01) | |
| *H01L 33/58* | (2010.01) | |
| *G02B 19/00* | (2006.01) | |
| *G02B 27/09* | (2006.01) | |

(52) U.S. Cl.
CPC ............. *H01L 33/58* (2013.01); *G02B 3/08* (2013.01); *G02B 19/0028* (2013.01); *G02B 19/0061* (2013.01); *G02B 27/0955* (2013.01); *G02B 27/0977* (2013.01)

(58) Field of Classification Search
CPC .. G02B 3/08; G02B 19/0028; G02B 27/0955; G02B 27/0977; G02B 19/0061; G02B 19/0066; G02B 19/0014; G02B 3/005; G02B 3/0012; G02B 3/0031; G02B 3/0018; G02B 3/0056; G02B 3/0068; G02B 3/02; G02B 5/045; G02B 5/22; G02B 5/23; G02B 5/32; G02B 5/124; G02B 5/188; G02B 5/1842; G02B 5/1857; G02B 5/1876; H01L 33/58; H01L 31/0543; B29D 11/00269; C03B 19/02; G02F 1/0121; G02F 1/15;
(Continued)

(56) References Cited

U.S. PATENT DOCUMENTS 4,772,797 A * 9/1988 Kahl ................. G08B 13/193
                                              250/342
5,071,207 A * 12/1991 Ceglio .................. G02B 5/188
                                              250/505.1
(Continued)

FOREIGN PATENT DOCUMENTS

WO    2013/065408 A1    5/2013
WO    2014/073158 A1    5/2014

OTHER PUBLICATIONS

Search Report of the German Patent and Trademark Office dated Jun. 24, 2015 for corresponding German Application No. 10 2014 112 891.5.

*Primary Examiner* — Mustak Choudhury
(74) *Attorney, Agent, or Firm* — DLA Piper LLP (US)

(57) ABSTRACT

An optical element has a first surface and a second surface opposite the first surface. The first surface is subdivided into at least one first segment and a second segment. The segments in each case adjoin a midpoint of the first surface. Each segment has a tooth structure having teeth extending along tooth extension directions. The tooth extension directions have bends at boundaries between the segments.

13 Claims, 4 Drawing Sheets

(58) Field of Classification Search
CPC .......... G02F 1/29; G02F 1/172; G02F 1/1334; G11C 13/04
USPC ....... 359/457, 619–631, 649, 726, 834, 850, 359/558, 851, 15–25, 563–572, 738–743; 362/84, 268, 331; 257/98; 351/159.35, 351/159.61, 169.74; 355/67
See application file for complete search history.

(56) References Cited

U.S. PATENT DOCUMENTS

| | | | | |
|---|---|---|---|---|
| 5,712,730 | A | * | 1/1998 | Zarschitzky ............. G02B 5/32 359/558 |
| 2010/0282299 | A1 | * | 11/2010 | Dyson ...................... F24J 2/085 136/246 |
| 2012/0060920 | A1 | * | 3/2012 | Fornari ............ B29D 11/00269 136/259 |

* cited by examiner

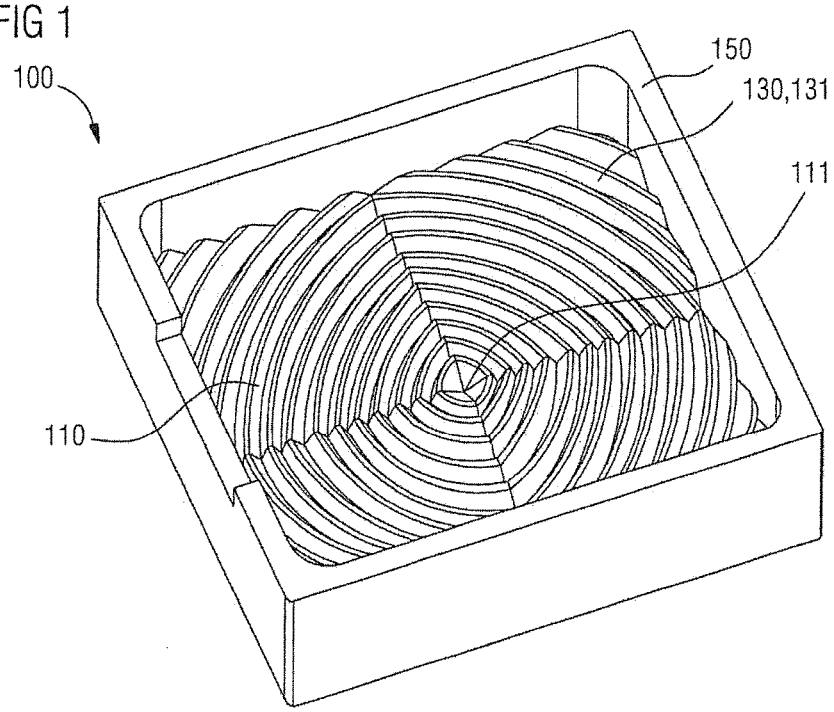
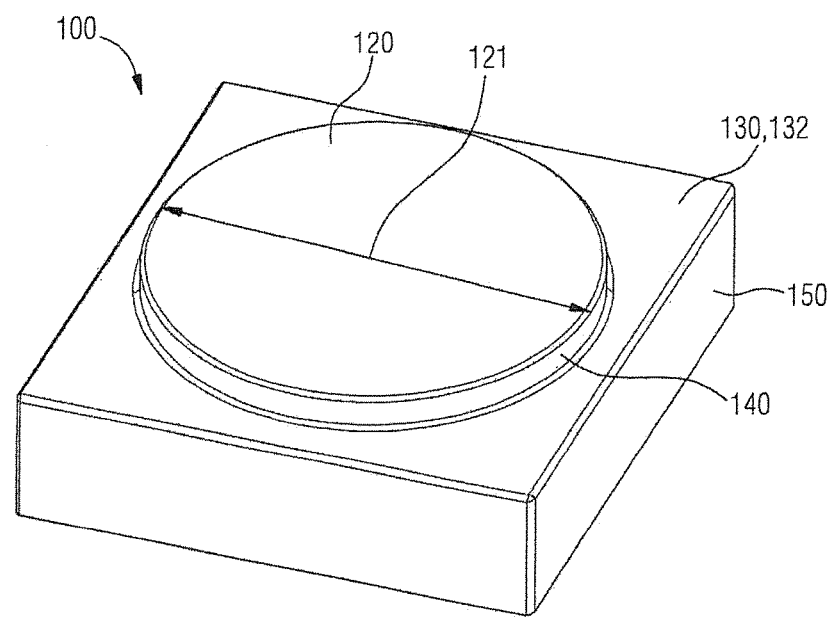

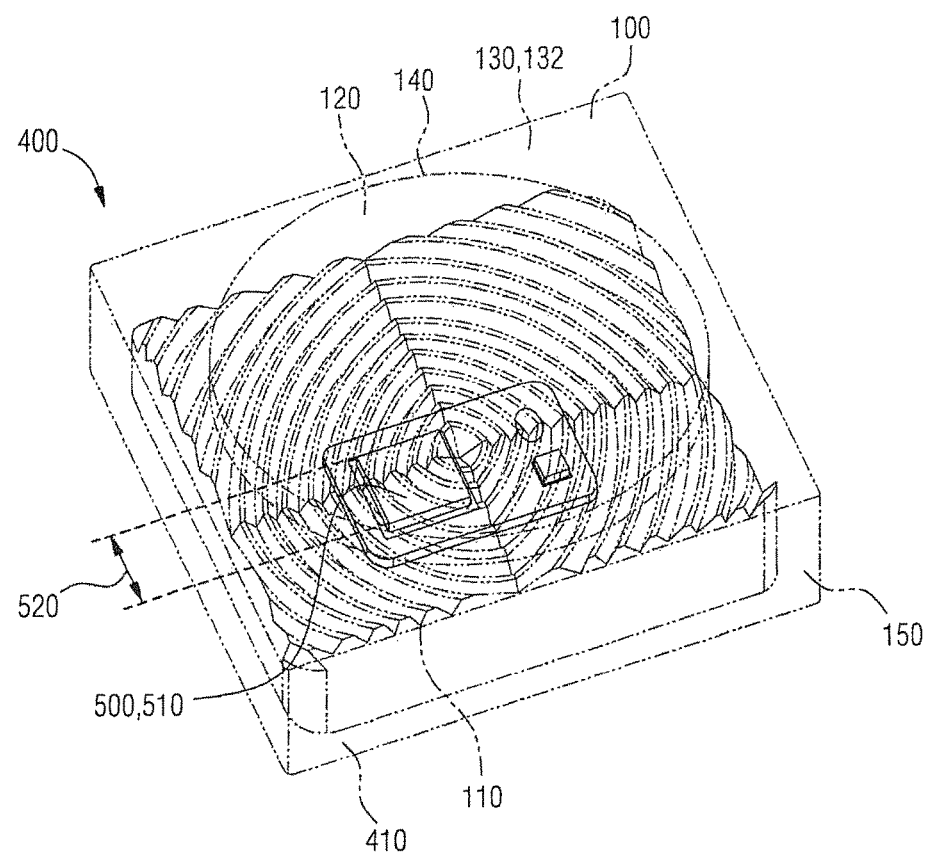

OPTICAL ELEMENT AND OPTOELECTRONIC COMPONENT

TECHNICAL FIELD

This disclosure relates to an optical element and an optoelectronic component.

BACKGROUND

It is known to equip optoelectronic components, for example, light emitting diode components with optical elements for beam shaping. For some applications it is desirable to embody such an optical element such that an optoelectronic semiconductor chip of the optoelectronic component is not visible from outside the optoelectronic component in the switched-off state. Moreover, it may be desirable to embody the optical element in a planar manner on a side facing away from the optoelectronic semiconductor chip. Only one side of the optical element is then available for beam shaping.

SUMMARY

I provide an optical element having a first surface and a second surface opposite the first surface, wherein the first surface is subdivided into at least a first segment and a second segment, each segment adjoins a midpoint of the first surface, each segment has a tooth structure having teeth extending along tooth extension directions, and the tooth extension directions have bends at boundaries between the segments.

I also provide an optical element having a first surface and a second surface opposite the first surface, wherein the first surface is subdivided into at least a first segment and a second segment, each segment adjoins a midpoint of the first surface, each segment has a tooth structure having teeth extending along tooth extension directions, wherein the tooth extension directions have bends at boundaries between the segments, and the tooth extension directions in the region of a segment are curved toward the midpoint.

I further provide an optoelectronic component including an optical element and an optoelectronic semiconductor chip, the optical element having a first surface and a second surface opposite the first surface, wherein the first surface is subdivided into at least a first segment and a second segment, each segment adjoins a midpoint of the first surface, each segment has a tooth structure having teeth extending along tooth extension directions, the tooth extension directions have bends at boundaries between the segments, and the first surface of the optical element faces a radiation emission face of the optoelectronic semiconductor chip.

BRIEF DESCRIPTION OF THE DRAWINGS

FIG. 1 shows a perspective view of an optical element from a first viewing direction.

FIG. 2 shows a perspective view of the optical element from a second viewing direction.

FIG. 7 shows a perspective illustration of an optoelectronic component including the optical element.

LIST OF REFERENCE SIGNS

Figure 3:
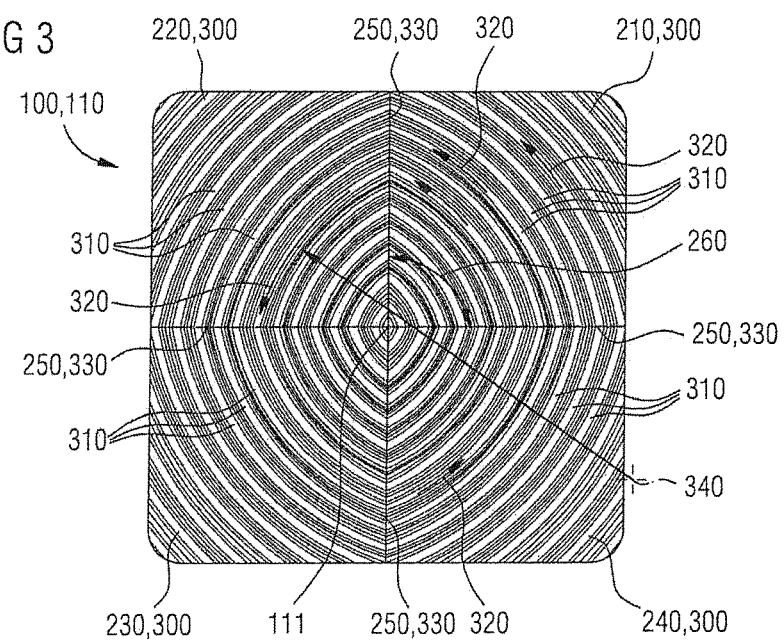
FIG. 3 shows a plan view of a first surface of the optical element in accordance with a first example.

100 Optical element
110 First surface
111 Midpoint
120 Second surface
131 Diameter
130 Base section
131 First side
132 Second side
140 Pedestal
150 Frame
210 First segment
220 Second segment
230 Third segment
240 Fourth segment
250 Boundary
260 Segment angle
300 Tooth structure
310 Tooth
311 Tip
312 Tooth angle
320 Direction
330 Bend
331 Direction change
340 Center of curvature
400 Optoelectronic component
410 Carrier
500 Optoelectronic semiconductor chip
510 Radiation emission face
520 Edge length
600 Incident light beam
610 Refracted light beam
620 Light beam subject to total internal reflection

DETAILED DESCRIPTION

My optical elements have a first surface and a second surface opposite the first surface. The first surface is subdivided into at least a first segment and a second segment. Each segment adjoins a midpoint of the first surface. Each segment has a tooth structure. The longitudinally extending teeth extend in selected directions defined as "tooth extension direction(s)". The tooth extension directions have bends at boundaries between the segments.

Advantageously, the tooth structures of the first surface subdivided into segments can serve for beam shaping in two spatial directions. In this case, the tooth structures of the plurality of segments can advantageously be producible more simply than a continuous tooth structure extending over the entire first surface. The subdivision of the beam-shaping first surface of the optical element can additionally enable non-rotationally symmetrical beam shaping, thereby affording an advantageous possibility for adapting the geometry of the beam shaping to a target geometry to be illuminated.

In one example of the optical element, all the segments, as viewed from the midpoint of the first surface, sweep over identical angles. This advantageously results in a particularly simple design of the first optical element, which can simplify the production of the first optical element.

In another example of the optical element, the teeth contained in each tooth structure are arranged concentrically. This also facilitates the production of the optical element.

The tooth extension directions in the region of a segment may each be rectilinear or curved toward the midpoint or curved away from the midpoint. This advantageously enables an adaptation of the geometry of beam shaping brought about by the optical element to a geometry of a spatial region to be illuminated. Beam concentration can be achieved with tooth extension directions that are rectilinear or curved toward the midpoint. Beam expansion can be achieved with tooth extension directions that are curved away from the midpoint of the first surface.

The tooth extension directions in the region of a segment may be curved around a point arranged outside the segment. This means that the curvatures of the tooth extension directions in the region of the segment have a large radius. As a result, the tooth structures of the segment are advantageously producible in a simple manner.

The teeth contained in tooth structures of two adjacent segments may continue continuously at the boundary between the segments. This supports continuous beam shaping at the segment boundaries by the optical element and additionally advantageously facilitates the production of the optical element.

Two segments may be rotationally symmetrical with respect to one another with regard to a rotation about the midpoint of the first surface. This advantageously results in a simple geometry of the optical element, thereby simplifying the production of the optical element. The rotationally symmetrical example of both segments of the optical element additionally supports rotationally symmetrical beam shaping by the optical element.

The first surface may be mirror-symmetrical. In this case, the first surface can be, for example, mirror-symmetrical only relative to one mirror axis or else mirror-symmetrical relative to a plurality of mirror axes. The mirror-symmetrical example of the first surface results in a simple geometry of the optical element which can facilitate production of the optical element. A mirror-symmetrical example of the first surface of the first element additionally supports mirror-symmetrical beam shaping by the optical element.

The tooth structures may extend as far as the midpoint of the first surface. As a result, the optical element is advantageously suitable to cover an optoelectronic semiconductor chip of an optoelectronic component, wherein the optoelectronic semiconductor chip covered by the optical element is not discernible from outside even in the central region.

Each tooth may form at its tip a tooth angle that is greater than 30° and less than 45°. This enables a total internal reflection of light rays at the interfaces of the teeth of the tooth structures of the optical element.

The latter may comprise an optically transparent plastic. This advantageously allows simple and cost-effective production of the optical element.

The second surface may be planar. This advantageously enables an inconspicuous arrangement of the optical element, for example, an arrangement of the optical element in a perforation of a housing wall of a device.

The second surface may be circular or elliptic. This advantageously also supports an inconspicuous arrangement of the optical element, for example, in a cutout of a housing wall of a technical device.

The latter may comprise a frame enclosing the first surface. The frame can enable the optical element to be fixed to an optoelectronic component.

Each segment of the optical element may be a segment of a Fresnel lens. As a result, the optical element can advantageously have a small thickness, which enables an arrangement of the optical element in devices with limited availability of space.

The tooth structures may form a total internal reflection lens. As a result, the tooth structures advantageously enable a great beam deflection, which enables the optical element to have a small focal length despite a small thickness.

An optoelectronic component comprises an optical element of the abovementioned type and an optoelectronic semiconductor chip. In this case, the first surface of the optical element faces a radiation emission face of the optoelectronic semiconductor chip. The optoelectronic semiconductor chip can be a light emitting diode chip (LED chip), for example. The optical element of this optoelectronic component advantageously enables beam shaping of electromagnetic radiation emitted by the optoelectronic semiconductor chip of the optoelectronic component. At the same time, the optical element covers the optoelectronic semiconductor chip, as a result of which the optoelectronic semiconductor chip is advantageously not or not clearly discernible from outside the optoelectronic component when the optoelectronic component is switched off.

A diameter of the second surface of the optical element may be greater than twice an edge length of the optoelectronic semiconductor chip and less than five times the edge length of the optoelectronic semiconductor chip. The optical element of the optoelectronic component then advantageously enables effective beam shaping of electromagnetic radiation emitted by the optoelectronic semiconductor chip.

The above-described properties, features and advantages and the way in which they are achieved will become clearer and more clearly understood in association with the following description of the examples which are explained in greater detail in association with the drawings.

FIG. 1 shows a schematic perspective illustration of an optical element 100 from a first viewing direction. FIG. 2 shows a schematic perspective illustration of the optical element 100 from a different viewing direction. The optical element 100 can cover and beam shape in a light emitting optoelectronic component, for example, in a light emitting diode component.

The optical element 100 is preferably integral and can be produced, for example, by an injection molding method or some other molding method. The optical element 100 comprises an optically transparent material. Preferably, the optical element 100 comprises an optically transparent plastic.

The optical element 100 comprises a base section 130, which is as a substantially rectangular plate having a first side 131 and a second side 132 opposite the first side 131. A frame 150 adjoins the first side 131 of the base section 130 of the optical element 100. The frame 150 delimits a cavity, the bottom of which is formed by the base section 130 of the optical element 100.

It is discernible in FIG. 1 that the base section 130 of the optical element 100 has a first surface 110 at its first side 131. It is discernible in FIG. 2 that the base section 130 of the optical element 100 has an elevated pedestal 140 at its second side 132. A top face of the pedestal 140 forms a second surface 120. The second surface 120 is planar. The second surface 120 is elliptic in the example illustrated, but can also be circular, rectangular or with some other shape.

FIG. 3 shows a plan view of the first surface 110 of the optical element 100 in accordance with a first example. The first surface 110 is subdivided into a first segment 210, a second segment 220, a third segment 230 and a fourth segment 240. The segments 210, 220, 230, 240 are arranged around a midpoint 111 of the first surface 110. The segments

210, 220, 230, 240 can also be regarded as angular segments which form a segment angle 260 in each case as viewed from the midpoint 111 of the first surface 110. In the example illustrated in FIG. 3, the segment angle 260 is of identical magnitude in all four segments 210, 220, 230, 240 and is 90°.

It is also possible, however, to subdivide the first surface 110 of the optical element 100 into more or fewer than four segments, for example, into two, three, five, six, seven, eight, nine, ten, eleven, twelve, thirteen, fourteen, fifteen or sixteen segments. In this case, the segment angle 260 can be of identical magnitude in all the segments of the first surface 110 and can have a value amounting to 360° divided by the number of segments. However, the individual segments into which the first surface 110 is subdivided can also have different segment angles 260.

Each of the segments 210, 220, 230, 240 of the first surface 110 of the optical element 100 has a tooth structure 300 having teeth 310 extending along directions 320. The individual teeth 310 contained in the tooth structures 300 are elongated ribs extending along the curved tooth extension directions 320. The individual teeth 310 contained in the tooth structure 300 of each segment 210, 220, 230, 240 are arranged concentrically. The tooth extension directions 320 of the teeth 310 contained in a tooth structure 300 thus run parallel to one another. The segments 210, 220, 230, 240 thus in each case form segments of Fresnel lenses.

In the example illustrated in FIG. 3, the tooth extension directions 320 of the tooth structures 300 of all the segments 210, 220, 230, 240 of the first surface 110 are curved toward the midpoint 111 of the first surface 110. In this case, the tooth extension directions 320 of the tooth structure 300 of each segment 210, 220, 230, 240 are each curved about a center 340 of curvature, which, in the example illustrated, lies outside the respective segment 210, 220, 230, 240 and, in particular, does not coincide with the midpoint 111 of the first surface 110. In this case, the center 340 of curvature also need not be arranged on a diagonal of the first surface 110. This means that the curved tooth extension directions 320 of the tooth structures 300 of the segments 210, 220, 230, 240 have radii of curvature that are larger than would be the case for a curvature of the tooth extension directions 320 of the tooth structures 300 around the midpoint 111 of the first surface 110.

This has the consequence that the tooth extension directions 320 of the tooth structures 300 have bends 330 at boundaries 250 between the segments 210, 220, 230, 240. The tooth extension directions 320 of the teeth 310 contained in the tooth structure 300 of a segment 210, 220, 230, 240, therefore, do not merge smoothly into the tooth extension directions 320 of the teeth 310 contained in the tooth structure 300 of the adjacent segment 210, 220, 230, 240 at the boundaries 250 between the segments 210, 220, 230, 240. Tangential directions of the tooth extension directions 320 of the teeth 310 contained in the tooth structures 300 have discontinuities at the boundaries 250 between the segments 210, 220, 230, 240.

The first surface 110 of the optical element 100 is mirror-symmetrical with respect to a mirroring at a vertical mirror axis and mirror-symmetrical with respect to a mirroring at a horizontal mirror axis. This means that the first segment 210 and the fourth segment 240 can be mapped onto the second segment 220 and the third segment 230 by a mirroring at the vertical mirror axis. The first segment 210 and the second segment 220 can be mapped onto the fourth segment 240 and the third segment 230 by a mirroring at the horizontal mirror axis. Consequently, the first segment 210 can also be mapped onto the third segment 230 by a rotation about the midpoint 111. Correspondingly, the second segment 220 is rotationally symmetrical with respect to the fourth segment 240. It is possible, however, to dispense with the symmetries of the segments 210, 220, 230, 240 of the first surface 110 of the optical element 100.

The teeth 310 contained in the tooth structures 300 of the individual segments 210, 220, 230, 240 merge into one another in a continuously connected fashion at the boundaries 250 between the segments 210, 220, 230, 240. However, this is not absolutely necessary either. Adjacent segments 210, 220, 230, 240 of the first surface 110 of the optical element 100 can alternatively also be formed, for example, such that the teeth 310 contained in the tooth structure 300 of a segment 210, 220, 230, 240 adjoin grooves arranged between the teeth 310 contained in the tooth structure 300 of an adjacent segment 210, 220, 230, 240.

The tooth structures 300 preferably cover all the segments 210, 220, 230, 240 of the first surface 110 of the optical element 100 completely. In particular, the tooth structures 300 in all the segments 210, 220, 230, 240 preferably extend as far as the midpoint 111 of the first surface 110.

The tooth structures 300 of the segments 210, 220, 230, 240 of the first surface 110 of the optical element 100 concentrate electromagnetic radiation, for example, visible light, that impinges on the first surface 110 of the optical element 100 in both spatial directions parallel to the first surface 110.

The curvature of the tooth extension directions 320 of the tooth structures 300 of the segments 210, 220, 230, 240 of the first surface 110 of the optical element 100 in FIG. 3, the curvature being oriented toward the midpoint 111 of the first surface 110, is chosen merely by way of example. It is also possible for the tooth extension directions 320 of the tooth structures 300 of all the segments 210, 220, 230, 240 to be curved away from the midpoint 111 of the first surface 110. It is likewise possible for the tooth extension directions 320 of the tooth structures 300 in each segment 210, 220, 230, 240 of the first surface 110 of the optical element 100 to each run in a rectilinear manner, as shown in the schematic illustration in FIG. 4. In the example illustrated in FIG. 4, the tooth extension directions 320 of the teeth 310 contained in the tooth structures 300 of each segment 210, 220, 230, 240 are each not curved, but rather rectilinear. The teeth 310 contained in each tooth structure 300 thus form rectilinear bars that are parallel to one another.

However, the tooth extension directions 320 of the tooth structures 300 of the individual segments 210, 220, 230, 240 are oriented differently in each case such that the tooth extension directions 320 nevertheless each have bends 330 at the boundaries 250 between the segments 210, 220, 230, 240. The tooth extension directions 320 of the tooth structures 300 each experience direction changes 331 at the boundaries 250 between the segments 210, 220, 230, 240. The direction changes 331 need not be identical at all the boundaries 250 between the segments 210, 220, 230, 240 and, in particular, need not necessarily correspond to the segment angles 260. In the example shown in FIG. 2, the tooth extension directions 320 at the boundary 250 between the first segment 210 and the second segment 220 experience a direction change 331 of more than 90°, for example, while the tooth extension directions 320 at the boundary 250 between the second segment 220 and the third segment 330 experience a direction change 331 of less than 90°.

Figure 4:
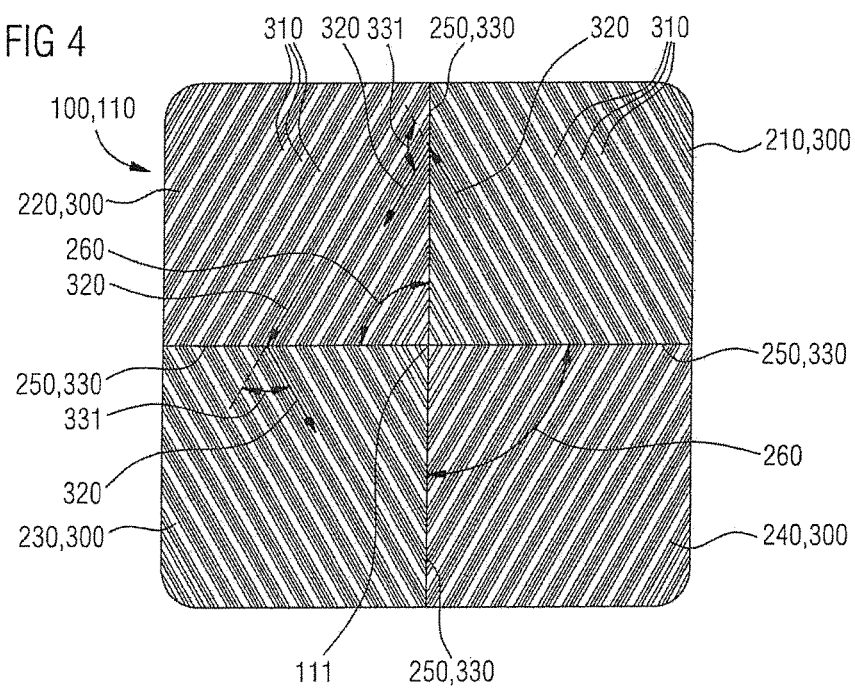
FIG. 4 shows a plan view of the first surface of the optical element in accordance with a second example.

In all further properties, the optical element 100 having the first surface 110 having the segments 210, 220, 230, 240 having the tooth structures 300 in the example illustrated in FIG. 4 corresponds to the example illustrated in FIG. 3.

Figure 5:
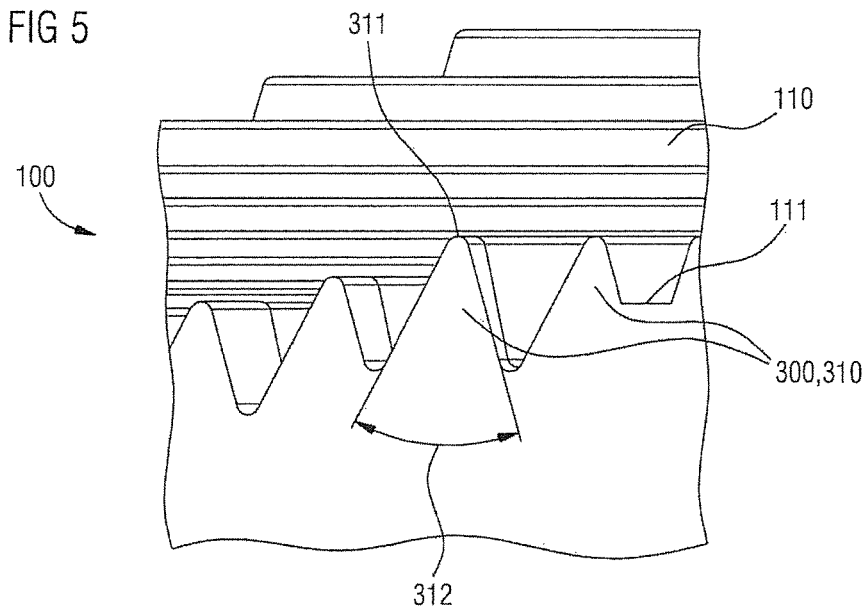
FIG. 5 shows a sectional side view of a part of the optical element.

FIG. 5 shows a schematic sectional side view of a part of the tooth structure 300 of a segment 210, 220, 230, 240 of the first surface 110 of the optical element 100 of the example explained with reference to FIG. 4. It is discernible that each tooth 310 contained in the tooth structure 300 has a tip 311. The tooth 310 forms a tooth angle 312 at the tip 311. The tooth angle 312 is preferably 30° to 45°. This makes it possible for refraction and total internal reflection to take place at the surfaces of the teeth 310 of the tooth structure 300, as is explained below with reference to FIG. 6.

Figure 6:
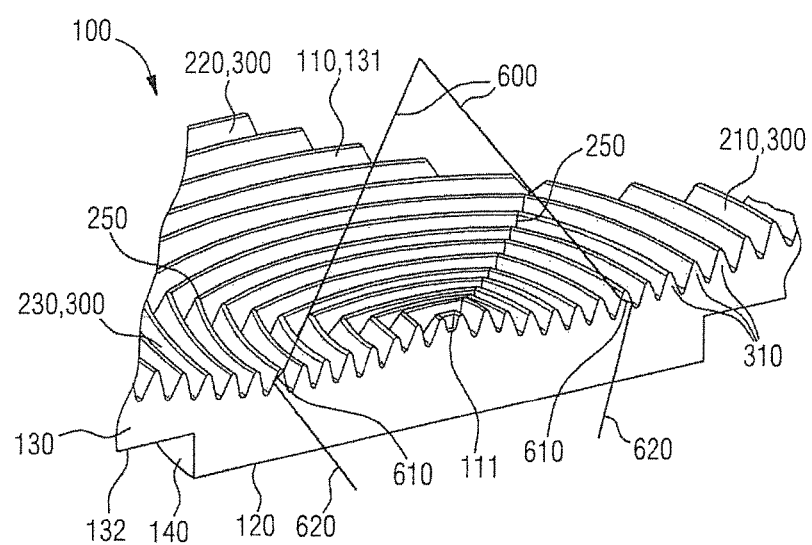
FIG. 6 shows a sectional perspective view of a part of the first surface of the optical element.

FIG. 6 shows a partial sectional perspective view of a part of the optical element 100 in the example explained with reference to FIG. 3. A beam path of light impinging on the first surface 110 of the optical element 100 is likewise illustrated. The light impinges as a divergent light beam on the first surface 110 of the optical element 100. Upon passing through the optical element 100, the light is deflected and concentrated by the tooth structures 300 of the segments 210, 220, 230, 240 of the first surface 110 of the optical element 100 such that the light emerges from the optical element 100 as a convergent beam at the second surface 120.

An incident light beam 600 impinges on a surface of one of the teeth 310 contained in one of the tooth structures 300, the surface being oriented toward the midpoint 111 of the first surface 110. Upon entering the tooth 310, the incident light beam 600 is refracted and passes as a refracted light beam 610 as far as that surface of the respective tooth 310 facing away from the midpoint 111 of the first surface 110. There the refracted light beam 610 impinges on the surface of the tooth 310 at an angle greater than the critical angle of total internal reflection such that the refracted light beam 610 is subjected to total internal reflection. As light beam 620 subject to total internal reflection, the light beam passes further through the optical element 100 and emerges from the optical element 100 at the second surface 120. The tooth structures 300 of the first surface 110 of the optical element 100 thus form a total internal reflection lens.

FIG. 7 shows a schematic perspective and partially transparent illustration of an optoelectronic component 400. The optoelectronic component 400 can be a light emitting diode component (LED component), for example. The optoelectronic component 400 can serve, for example, as a flashlight device in a cellphone.

The optoelectronic component 400 comprises a carrier 410 and the optical element 100. An optoelectronic semiconductor chip 500 is arranged on a surface of the carrier. The optoelectronic semiconductor chip 500 emits electromagnetic radiation, for example, visible light at a radiation emission face 510. The optoelectronic semiconductor chip 500 can be a light emitting diode chip (LED chip), for example.

The optical element 100 is arranged above the carrier 410 such that the optoelectronic semiconductor chip 500 is enclosed between the carrier 410 and the optical element 100 in the cavity of the optical element 100, the cavity being formed by the frame 150. The first surface 110 of the optical element 100 faces the radiation emission face 510 of the optoelectronic semiconductor chip 500.

During operation of the optoelectronic component 400, electromagnetic radiation is emitted by the optoelectronic semiconductor chip 500. The optical element 100 brings about beam shaping of the radiation emitted by the optoelectronic semiconductor chip 500, for example, concentration of the radiation emitted by the optoelectronic semiconductor chip 500 or divergence of the electromagnetic radiation emitted by the optoelectronic semiconductor chip 500. The electromagnetic radiation shaped by the optical element 100 emerges from the optical element 100 at the second surface 120.

The elevated pedestal 140 of the optical element 100, the pedestal having the second surface 120 can be arranged, for example, in a cutout of a housing of a device such that the second surface 120 of the optical element 100 is flush with an outer side of the housing of the device. The second surface 120 has a diameter 131. Preferably, the diameter 131 of the second surface 120 is at least twice the magnitude of an edge length 520 of the optoelectronic semiconductor chip 500 and is likewise preferably less than five times the edge length 520 of the optoelectronic semiconductor chip 500. The first surface 110 of the optical element 100 preferably has an edge length corresponding approximately to the diameter 131 of the second surface 120.

My elements and components have been illustrated and described in greater detail on the basis of the preferred examples. Nevertheless, this disclosure is not restricted to the examples disclosed. However, other variations can be derived therefrom by those skilled in the art, without departing from the scope of protection of appended claims.

The invention claimed is:

1. An optical element comprising a first surface and a second surface opposite the first surface,
    wherein the first surface is subdivided into two or more segments,
    each segment adjoins a midpoint of the first surface,
    each segment has a tooth structure forming a total internal reflection lens and having projections extending along tooth extension directions, and
    the tooth extension directions have bends at boundaries between the segments,
    wherein the projections contained in the tooth structures of two adjacent segments continue continuously at the boundary between the segments,
    the optical element comprises a frame enclosing the first surface, and
    the frame defines a cavity, the bottom of the cavity formed by a base section of the optical element.

2. The optical element as claimed in claim 1, wherein all the segments, as viewed from that midpoint, are arranged at identical angles.

3. The optical element as claimed in claim 1, wherein the projections contained in each tooth structure are arranged concentrically.

4. The optical element as claimed in claim 1, wherein the tooth extension directions in the region of a segment are rectilinear or curved toward the midpoint or curved away from the midpoint.

5. The optical element as claimed in claim 4, wherein the tooth extension directions in the region of a segment are curved around a point arranged outside the segment.

6. The optical element as claimed in claim 1, wherein two segments are rotationally symmetrical with respect to one another with regard to a rotation about the midpoint of the first surface.

7. The optical element as claimed in claim 1, wherein the first surface is mirror-symmetrical.

8. The optical element as claimed in claim 1, wherein the tooth structures extend as far as the midpoint of the first surface.

9. The optical element as claimed in claim 1, wherein each projection forms at its tip a tooth angle that is greater than 30° and less than 45°.

10. The optical element as claimed in claim 1, wherein the optical element comprises an optically transparent plastic.

11. The optical element as claimed in claim 1, wherein the second surface is planar.

12. The optical element as claimed in claim 1, wherein the second surface is circular or elliptic.

13. The optical element as claimed in claim 1, wherein each segment is a segment of a Fresnel lens.

* * * * *